United States Patent [19]

Ponkala

[11] 4,295,090

[45] Oct. 13, 1981

[54] ELECTRONIC SELECTOR SWITCH PARTICULARLY FOR USE IN RADIOSCONDES

[75] Inventor: Jorma Ponkala, Helsinki, Finland

[73] Assignee: Vaisala Oy, Finland

[21] Appl. No.: 100,199

[22] Filed: Dec. 4, 1979

Related U.S. Application Data

[63] Continuation of Ser. No. 950,546, Oct. 12, 1978.

[30] Foreign Application Priority Data

Oct. 14, 1977 [FI] Finland ............................. 773064

[51] Int. Cl.³ ...................... G01R 27/26; G01R 19/26
[52] U.S. Cl. .............................. 324/60 CD; 324/60 C; 324/61 R; 324/120; 340/870.37
[58] Field of Search ............. 324/60 C, 60 CD, 60 R, 324/61 R, 65 R, 120; 340/870.37

[56] References Cited

U.S. PATENT DOCUMENTS

| | | | |
|---|---|---|---|
| 2,937,369 | 5/1960 | Newbold et al. | 324/60 CD |
| 3,631,342 | 12/1971 | McDonald | 324/120 |
| 3,753,373 | 8/1973 | Brown | 324/61 R |
| 4,023,094 | 5/1977 | Adams | 324/65 R |

*Primary Examiner*—Ernest F. Karlsen
*Attorney, Agent, or Firm*—Steinberg & Raskin

[57] ABSTRACT

The output of each of a plurality of CMOS inverting amplifiers is connected to a corresponding one of a plurality of impedances to be measured. A stepping circuit is connected to the inputs of the amplifiers. A voltage supply is connected to the amplifiers and provides a signal to be measured which is directed via a corresponding one of the amplifiers to an impedance measuring circuit connected to the impedances to be measured in common. The impedance measuring circuit produces an output impedance proportional to the impedances to be measured.

7 Claims, 4 Drawing Figures

ELECTRONIC SELECTOR SWITCH PARTICULARLY FOR USE IN RADIOSCONDES

This is a continuation, of application Ser. No. 950,546, filed Oct. 12, 1978.

BACKGROUND OF THE INVENTION

The present invention relates to an electronic selector switch. More particularly, the invention relates to an electronic selector switch for telemetrical use in radiosondes, by means of which a group of impedances to be measured can be connected with a measuring circuit.

SUMMARY OF THE INVENTION

The principal characteristic feature of the invention is that it utilizes a circuit of CMOS inverters, or the like, as an electronic switch. The outputs of the various amplifiers of the circuit are connected to the circuit to be measured, and inputs of these amplifiers are connected to a stepping circuit. The signal to be measured is directed to the input of the measuring circuit from the voltage supply of the CMOS circuit, or the like.

Accordingly, it is an object of this invention to provide an electronic selector switch which is simpler and more fail-safe than previous switch types.

Another object of the invention is to provide a measuring circuit particularly suitable for use with an electronic selector switch in accordance with the invention, such measuring circuit being an RC oscillator circuit for measuring capacitances more accurately than before with the elimination of stray capacitances.

The foregoing and other objectives are attained by the switch of the invention.

The invention accordingly comprises the features of construction, combination of elements and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, wherein.

DESCRIPTION OF PREFERRED EMBODIMENTS

Figures 1, 2:
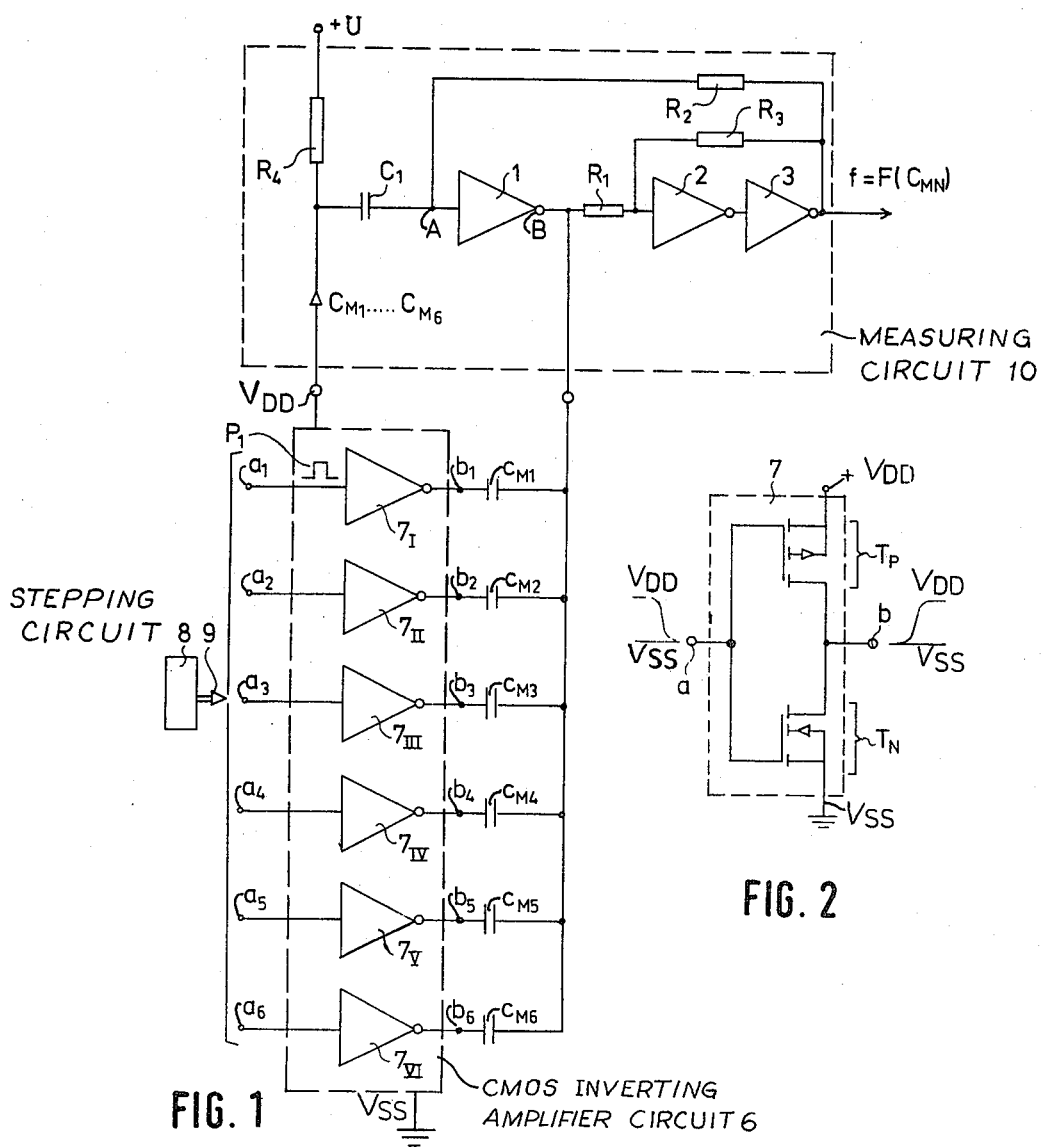
FIG. 1 is a schematic diagram of an embodiment of the electronic selector switch of the invention wherein the impedances to be measured are a group of capacitances which are sequentially connected to the measuring circuit via said switch.
FIG. 2 is a circuit diagram of the basic structure of a CMOS inverter of the switch of FIG. 1.

FIGS. 1 and 2 show a preferred embodiment of an electronic selector switch, connected to which is a special RC oscillator circuit. As shown in FIG. 1, the selector switch comprises a circuit of CMOS inverters with six amplifier units $7_I$-$7_{VI}$. A unique and new feature of the selector switch of the invention is that the amplifiers are connected "in the wrong way". More particularly, outputs $b_1$-$b_6$ of the various amplifiers $7_I$-$7_{VI}$, respectively, are connected to capacitances $C_{M1}$-$C_{M6}$, respectively, to be measured, and inputs $a_1$-$a_6$, respectively, are connected to a stepping circuit 8 known as such. The stepping circuit provides a pulse $P_1$ through the path indicated by an arrow 9, sequentially to each input terminal $a_1$-$a_6$ of the CMOS inverting amplifier circuit 6. The stepping circuit 8 and the amplifier circuit 6 preferably comprise a single commercially available integrated circuit.

FIG. 2 is a detailed example of the CMOS inverter amplifier in its simplest form. The CMOS inverter amplifier of FIG. 2 comprises two transistors $T_p$ and $T_N$, the transistor $T_p$ being a P channel MOS transistor and the transistor $T_N$ being an N channel MOS transistor. The resistance of the transistors $T_p$ and $T_N$ when conducting is in order of 500 ohms and is several decades higher when said transistors are non-conducting. As shown in FIG. 1, there are six amplifiers 7 of the described type in circuit 6, and all the drain voltages $V_{DD}$ of these amplifiers are interconnected, as are their source voltage $V_{SS}$.

An essential feature of the aforedescribed selector switch is, first, as hereinbefore stated, that the amplifiers 7 are connected "in the wrong way" and that the signal to be measured is directed to the measuring circuit from the voltage supply of the CMOS circuit, for example, from its drain voltage $V_{DD}$. As shown in FIG. 1, this occurs so that a resistor $R_4$ applies a drive voltage $+U$ to the selector switch and said voltage is separated from the RC oscillator circuit via a capacitance $C_1$, in accordance with the invention. The resistor $R_4$ is preferably in the order of 150 kilohms and the capacitance $C_1$ is preferably in the order of 10 nF. The capacitance $C_1$ must, of course, be sufficiently high to keep its influence on the frequency being measured insignificant. The value of approximately 10 nF for the capacitance $C_1$ is suitable, if measured capacitances $C_M$ are in the order of from a few pF's to a few tens of pF's. A typical operational feature of the aforedescribed electronic selector switch is that, as one of the capacitances $C_{M1}$-$C_{M6}$ is connected to the measuring circuit, as shown in FIG. 1, the other capacitances are grounded.

Figure 3:
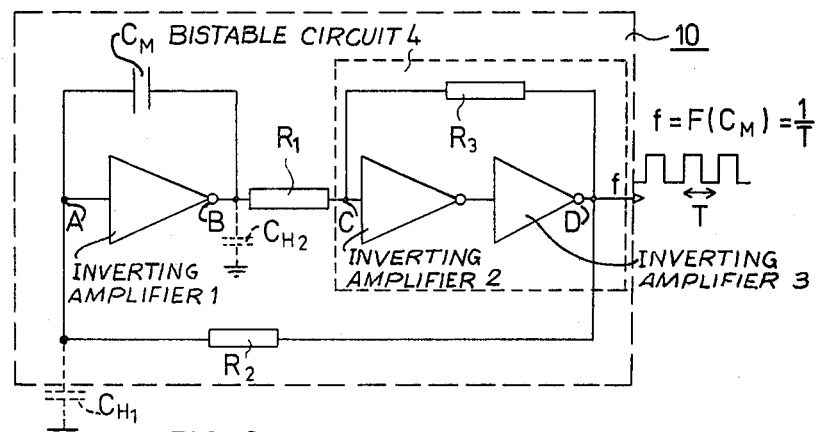
FIG. 3 is a schematic diagram of an embodiment of an RC oscillator circuit particularly suitable for use in combination with the electronic selector switch of the invention.
Figure 4:
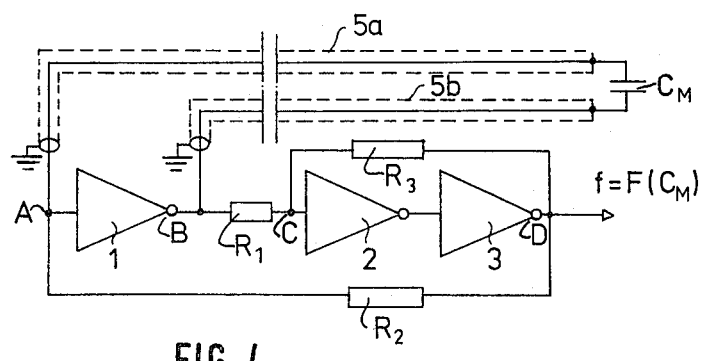
FIG. 4 is a schematic diagram of a modification of the embodiment of FIG. 3, wherein the capacitance to be measured is remotely connected to the measuring circuit via coaxial cables.

As shown in FIGS. 1, 3 and 4, the impedance measuring circuit 10 used with the electronic switch of the invention comprises an inverting amplifier 1 between points A and B. The inverting amplifier 1 is connected to the input C of a bistable circuit or bistable multivibrator circuit 4 via a resistor $R_1$. The bistable circuit 4 comprises two inverting amplifiers 2 and 3, as shown in the FIGS. The output D of the bistable circuit 4 is fed back to its input C via a resistor $R_3$. The bistable circuit 4 may consist of a Schmitt trigger circuit, for example, which typically features two voltage levels and hysteresis between such levels.

As shown in FIGS. 1, 3 and 4, the impedances to be measured are capacitances $C_M$ which are connected between the output B and the input A of the inverting amplifier 1. A frequency $f = 1/T$ is provided at the output D of the bistable circuit 4. This frequency is the measuring unit for the measured capacitance $C_M$, so that the output frequency of the RC oscillator circuit is preferably inversely proportional to the measured capacitance $C_M$. An essential feature of the circuit of the invention is that the output D of the bistable circuit 4 is fed back resistively via a resistor $R_2$ to the input A of the inverting amplifier 1. It is important that the input A of the inverting amplifier 1 be sufficiently distinctively separated from its output B. It is also important to have a sufficiently high resistive input impedance at the point A.

The aforedescribed circuitry functions as follows. Assume that, in the beginning, the point D is the positive side of the supply or input voltage. Current through the resistor $R_2$ then tends to raise the voltage at the point A. As the amplifier 1 is inverting, the rising tendency of the voltage at the point A tends to lower the voltage at the point B, and, via the measured capacitance $C_M$, to also lower the voltage at the point A. The result is that, in the ideal case, the voltage at the point A does not change at all. The measured capacitance $C_M$ is charged with constant current determined by the resistance $R_2$ and the voltage between the points D and A.

As the voltage at the point B is lowered to the lower triggering level of the bistable circuit 4, which may comprise a Schmitt trigger, the state of the bistable circuit changes and the voltage at the point D suddenly drops to the negative side of the supply voltage, from which moment the circuit continues to function as hereinbefore described. The current then flows in the opposite direction.

It is important to note in the foregoing description that the voltage at the point A did not change at all in any phase during the cycle. An important result of this fact is that stray capacitance $C_{H1}$, shown by broken lines in FIG. 3, and grounded at point A, has no influence on the output frequency f of the circuit, because the voltage at the point A does not change and consequently stray capacitance $C_{H1}$ is neither charged nor discharged. The situation is the same if stray capacitance is connected to the point B, since the output frequency f does not then change, due to the fact that in the ideal case, the inverting amplifier 1 is able to give or take a sufficiently high current to be able, in addition to its other functions, to charge and discharge such stray capacitance $C_{H2}$.

The foregoing description explains why, as shown in FIG. 4, the capacitance $C_M$ may be measured via a pair of coaxial cables $5a$ and $5b$, for example, relatively far from the actual measuring circuit. In practice, this is a very important advantage, since in radiosondes, for example, the measured capacitances are apart from each other and, in accordance with the invention, various capacitances can be connected, via coaxial cables, for example, to the aforedescribed measuring circuit without any loss of measuring accuracy.

It may be assumed that a resistor $R_0$ represents the output impedance of the inverting amplifier 1. In real amplifiers, this impedance is always in excess of 0 ohms. A voltage acts at the point D of FIG. 3. The current flowing through the resistor $R_2$ tends to change the voltage level of the point A. However, this does not occur for the following reasons.

If the conditions are slightly idealized, it may be assumed that the gain of amplifier is infinite. In such case, the voltage at the output of the inverting amplifier changes in a direction opposite to that in which the current through the resistor $R_2$ tends to shift at the point A, with such high speed that the voltage at the point B changes at a speed making the current through the capacitor $C_M$ equal to the current flowing through said resistor, but of opposite polarity. Consequently, the voltage at the point A indeed does not change.

It is also due to this feedback through the capacitor $C_M$ that the stray capacitance $C_{H2}$ has no influence on the operation. More particularly, the voltage at the output of the inverting amplifier changes, as hereinbefore described, in such a manner that the current in the resistor $R_0$ is as high as is required to pass through the feedback capacitor to the point A plus, additionally, to charge or discharge the stray capacitance $C_{H2}$. The stray capacitance $C_{H2}$ does not begin to exert an influence on the frequency of oscillation until the case in which said stray capacitance increases to become so large that the output of the inverting amplifier 1 is unable to supply a current as high as the charging and discharging of said stray capacitance would require.

An assembly of the aforedescribed type, consisting of an inverting amplifier and a capacitor connected across its input and output is known as a Miller integrator. As its name implies, such a unit integrates a square wave, thereby providing a sawtooth wave at the point B. Actually, of course, the stray capacitance $C_{H2}$ and the pick-up condensers connected across it have a slight effect on the frequency, because the amplifier does not have infinite gain. This is without significance in practice, however, if the gain is high enough.

The invention is by no means restricted to aforementioned details which are described only as examples; they may vary within the framework of the inventional idea as defined in the following claims.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An electronic selector switch for telemetrical use in measuring a plurality of impedances to be measured, said selector switch comprising
    an impedance measuring circuit;
    a plurality of CMOS inverting amplifiers each having an input and an output, the output of each of said amplifiers being connected to a corresponding one of the impedances to be measured; and
    a stepping circuit connected to the inputs of said amplifiers for connecting a selected one of said inverting amplifiers and the corresponding one of said impedances to be measured in said impedance measuring circuit and connecting the remaining inverting amplifiers and impedances to be measured to a point at ground potential whereby said impedance measuring circuit measures said one of said impedances to be measured free from the influence of said remaining impedances to be measured, said impedance measuring circuit producing an output frequency proportional to the impedance measured.

2. An electronic selector switch as claimed in claim 1, wherein said impedance measuring circuit includes an inverting amplifier having an input and an output, and said one of said inverting amplifiers and said one of said impedances to be measured are connected between said input and said output of said inverting amplifier.

3. An electronic selector switch as claimed in claim 1, further comprising a voltage supply including first and second supply voltages derived from a voltage source, the first supply voltage being connected to a point at ground potential, and a capacitance having a higher impedance than the impedances to be measured and a high resistance resistor connected between the voltage source and the inputs of said CMOS inverting amplifiers, said second supply voltage being connected to said inputs of said CMOS inverting amplifiers, said capacitance being connected between a common point in the connection between the resistor and said inputs of said CMOS inverting amplifiers and the input of said inverting amplifier of said impedance measuring circuit.

4. An electronic selector switch as claimed in claim 2, wherein said impedance measuring circuit further comprises a bistable circuit having an input connected to the output of said inverting amplifier, an output and an output frequency inversely proportional to said one of said impedances to be measured, and a resistive feedback connected from the output of the bistable circuit to the input of said inverting amplifier.

5. An electronic selector switch as claimed in claim 4, wherein said bistable circuit comprises a bistable multivibrator.

6. An electronic selector switch as claimed in claim 4, further comprising a pair of coaxial cables connecting said impedances to be measured to the input and output of said inverting amplifier.

7. An electronic selector switch as claimed in claim 4, wherein said bistable circuit comprises a Schmitt trigger.

* * * * *